(12) United States Patent
Inatsuka

(10) Patent No.: US 12,362,277 B2
(45) Date of Patent: Jul. 15, 2025

(54) SEMICONDUCTOR DEVICE

(71) Applicant: Kioxia Corporation, Tokyo (JP)

(72) Inventor: Takuya Inatsuka, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 509 days.

(21) Appl. No.: 17/901,770

(22) Filed: Sep. 1, 2022

(65) Prior Publication Data
US 2023/0307362 A1    Sep. 28, 2023

(30) Foreign Application Priority Data

Mar. 22, 2022   (JP) .................. 2022-045885

(51) Int. Cl.
| | | |
|---|---|---|
| *H01L 23/522* | (2006.01) | |
| *H01L 23/528* | (2006.01) | |
| *H10B 41/20* | (2023.01) | |
| *H10B 43/20* | (2023.01) | |
| *H10B 43/27* | (2023.01) | |

(52) U.S. Cl.
CPC ...... *H01L 23/5283* (2013.01); *H01L 23/5226* (2013.01); *H10B 41/20* (2023.02); *H10B 43/20* (2023.02)

(58) Field of Classification Search
CPC ............. H01L 23/5283; H01L 23/5226; H01L 21/76895; H01L 23/485; H10B 41/20; H10B 43/20; H10B 43/10; H10B 80/00; H10B 43/27; H10B 43/50
See application file for complete search history.

(56) References Cited

U.S. PATENT DOCUMENTS

| | | | |
|---|---|---|---|
| 10,553,603 B2 | 2/2020 | Yamashita | |
| 10,734,371 B2 * | 8/2020 | Park | ............ H10B 43/50 |
| 11,244,902 B2 * | 2/2022 | Kim | ............ H10B 43/50 |
| 2020/0279859 A1 | 9/2020 | Uchida | |
| 2021/0066329 A1 | 3/2021 | Ito | |
| 2021/0074638 A1 | 3/2021 | Sanuki et al. | |

FOREIGN PATENT DOCUMENTS

| | | |
|---|---|---|
| JP | 2020-141094 A | 9/2020 |
| JP | 2021-044399 A | 3/2021 |

* cited by examiner

*Primary Examiner* — David Vu
(74) *Attorney, Agent, or Firm* — Foley & Lardner LLP

(57) ABSTRACT

A semiconductor device includes a substrate including an element region that includes a first extending portion extending in a first direction and a plurality of first protruding portions protruding from the first extending portion in a second direction intersecting the first direction. The device further includes a first plug provided on the first extending portion and extending in the first direction and in a third direction intersecting the first direction and the second direction. The device further includes a plurality of gate electrodes respectively provided above the plurality of first protruding portions so as to respectively overlap with the plurality of first protruding portions in the third direction.

20 Claims, 14 Drawing Sheets

SEMICONDUCTOR DEVICE

CROSS-REFERENCE TO RELATED APPLICATION(S)

This application is based upon and claims the benefit of priority from Japanese Patent Application No. 2022-045885, filed Mar. 22, 2022, the entire contents of which are incorporated herein by reference.

FIELD

Embodiments described herein relate generally to a semiconductor device.

BACKGROUND

When a contact plug that is in contact with a substrate is formed, there is a problem in a positional relationship between the contact plug and a gate electrode on the substrate.

DETAILED DESCRIPTION

At least one embodiment provides a semiconductor device in which a plug that is in contact with a substrate can be suitably formed.

In general, according to at least one embodiment, a semiconductor device includes a substrate including an element region that includes a first extending portion extending in a first direction and a plurality of first protruding portions protruding from the first extending portion in a second direction intersecting the first direction. The device further includes a first plug provided on the first extending portion and extending in the first direction and in a third direction intersecting the first direction and the second direction. The device further includes a plurality of gate electrodes respectively provided above the plurality of first protruding portions so as to respectively overlap with the plurality of first protruding portions in the third direction.

Hereinafter, embodiments of the present disclosure will be described with reference to the drawings. In FIGS. 1 to 14, the same components are denoted by the same reference signs, and redundant description will be omitted.

First Embodiment

Figure 1:
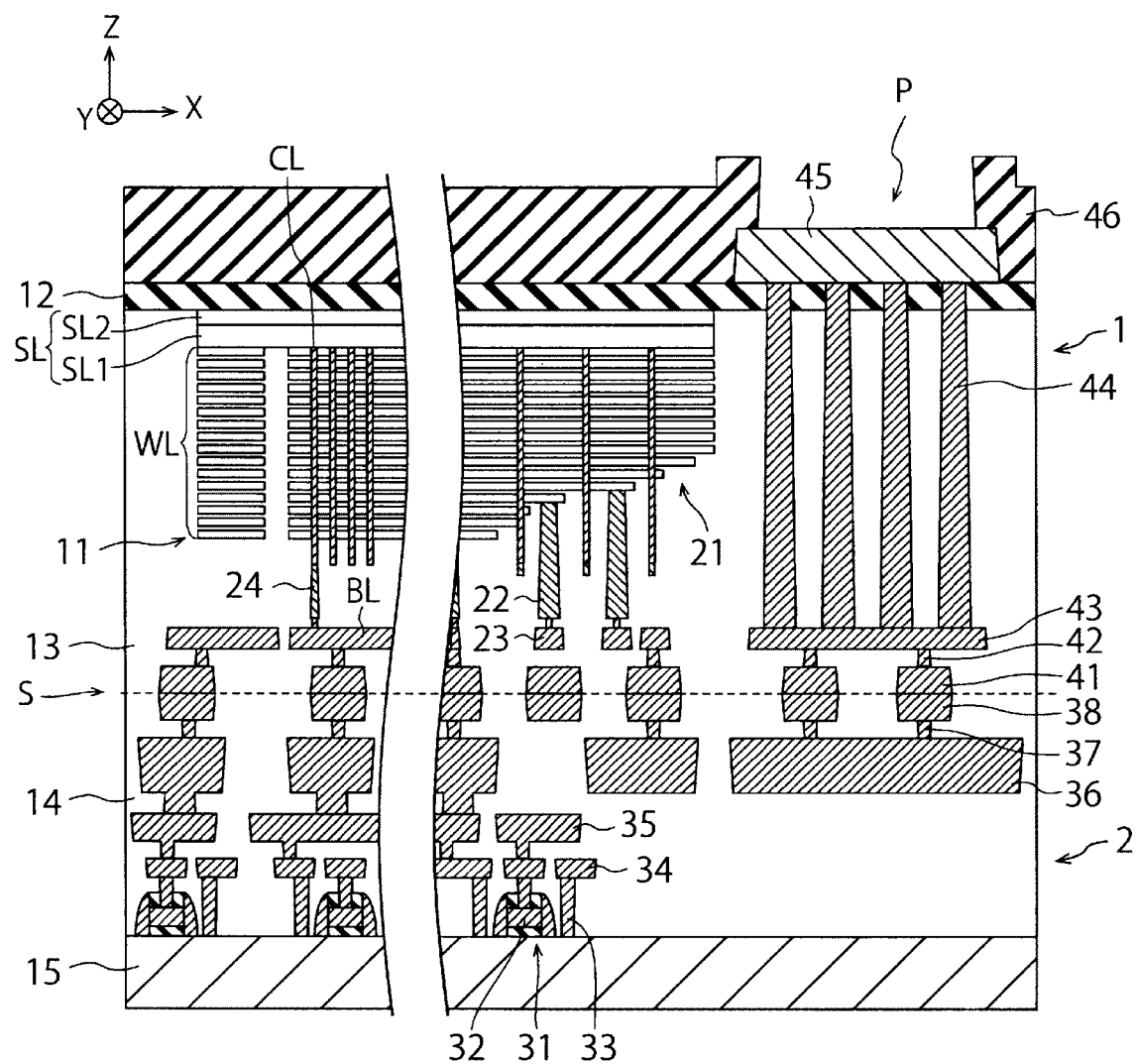
FIG. 1 is a cross-sectional view showing a structure of a semiconductor device according to a first embodiment.

FIG. 1 is a cross-sectional view showing a structure of a semiconductor device according to a first embodiment. The semiconductor device in FIG. 1 is a three-dimensional semiconductor memory in which an array chip 1 and a circuit chip 2 are bonded to each other.

The array chip 1 includes a memory cell array 11 including a plurality of memory cells, an insulating film 12 above the memory cell array 11, and an interlayer insulating film 13 below the memory cell array 11. The insulating film 12 is, for example, a silicon oxide film or a silicon nitride film. The interlayer insulating film 13 is, for example, a silicon oxide film or a stacked film including a silicon oxide film and another insulating film.

The circuit chip 2 is provided below the array chip 1. A reference sign "S" indicates a bonding surface of the array chip 1 and the circuit chip 2. The circuit chip 2 includes an interlayer insulating film 14 and a substrate 15 below the interlayer insulating film 14. The interlayer insulating film 14 is, for example, a silicon oxide film or a stacked film including a silicon oxide film and another insulating film. The substrate 15 is, for example, a semiconductor substrate such as a silicon substrate.

FIG. 1 shows an X direction and a Y direction parallel to a surface of the substrate 15 and perpendicular to each other and a Z direction perpendicular to the surface of the substrate 15. The X direction, the Y direction, and the Z direction intersect with one another. In the present specification, a +Z direction is regarded as an upward direction, and a −Z direction is regarded as a downward direction. The −Z direction may or may not coincide with the gravitational direction. A +X direction, a +Y direction, and the +Z direction are examples of a first direction, a second direction, and a third direction, respectively. A −X direction is an example of a direction opposite to the first direction, and a −Y direction is an example of a direction opposite to the second direction.

The array chip 1 includes, as a plurality of electrode layers in the memory cell array 11, a plurality of word lines WL and a source line SL. FIG. 1 shows a staircase structure portion 21 of the memory cell array 11. Each word line WL is electrically connected to a word wiring layer 23 via a contact plug 22. Each columnar portion CL penetrating the plurality of word lines WL is electrically connected to a bit line BL via a via plug 24 and is electrically connected to the source line SL. The source line SL includes a first layer SL1 which is a semiconductor layer and a second layer SL2 which is a metal layer.

The circuit chip 2 includes a plurality of transistors 31. Each transistor 31 includes a gate electrode 32 provided at the substrate 15 with a gate insulating film interposed therebetween, and a source diffusion layer and a drain diffusion layer (not shown) provided in the substrate 15. In addition, the circuit chip 2 includes a plurality of contact plugs 33, each of which is provided on the gate electrode 32, the source diffusion layer, or the drain diffusion layer of the transistor 31; a wiring layer 34 that is provided on these contact plugs 33 and that includes a plurality of wirings; and a wiring layer 35 that is provided on the wiring layer 34 and that includes a plurality of wirings.

The circuit chip 2 further includes a wiring layer 36 that is provided on the wiring layer 35 and that includes a plurality of wirings, a plurality of via plugs 37 provided on the wiring layer 36, and a plurality of metal pads 38 provided on the via plugs 37. The metal pad 38 includes, for example, a copper (Cu) layer. The circuit chip 2 functions as a control circuit (logic circuit) that controls an operation of the array chip 1. The control circuit is formed of the transistors 31 or the like, and is electrically connected to the metal pads 38.

The array chip 1 includes a plurality of metal pads 41 provided on the metal pads 38, a plurality of via plugs 42 provided on the metal pads 41, and a wiring layer 43 provided on the via plugs 42 and including a plurality of wirings. The metal pad 41 includes, for example, a Cu (copper) layer. The above-described control circuit is electrically connected to the memory cell array 11 via the metal pads 38 and 41.

The array chip 1 further includes a plurality of via plugs 44 provided on the wiring layer 43, a metal pad 45 provided on these via plugs 44 and the insulating film 12, and a passivation film 46 provided on the metal pad 45 and the insulating film 12. The metal pad 45 includes, for example, an aluminum (Al) layer, and functions as an external connection pad (bonding pad) of the semiconductor device in FIG. 1. The passivation film 46 is, for example, an insulating film such as a silicon oxide film, and has an opening P that exposes an upper surface of the metal pad 45. The metal pad 45 may be connected to a mounting substrate or another device by a bonding wire, a solder ball, a metal bump, and the like via the opening P.

The staircase structure portion 21 has a downward staircase structure in FIG. 1, but may have an upward staircase structure instead. In this case, the semiconductor device according to the present embodiment may include the circuit chip 2 above the array chip 1 instead of including the circuit chip 2 below the array chip 1.

Figure 2:
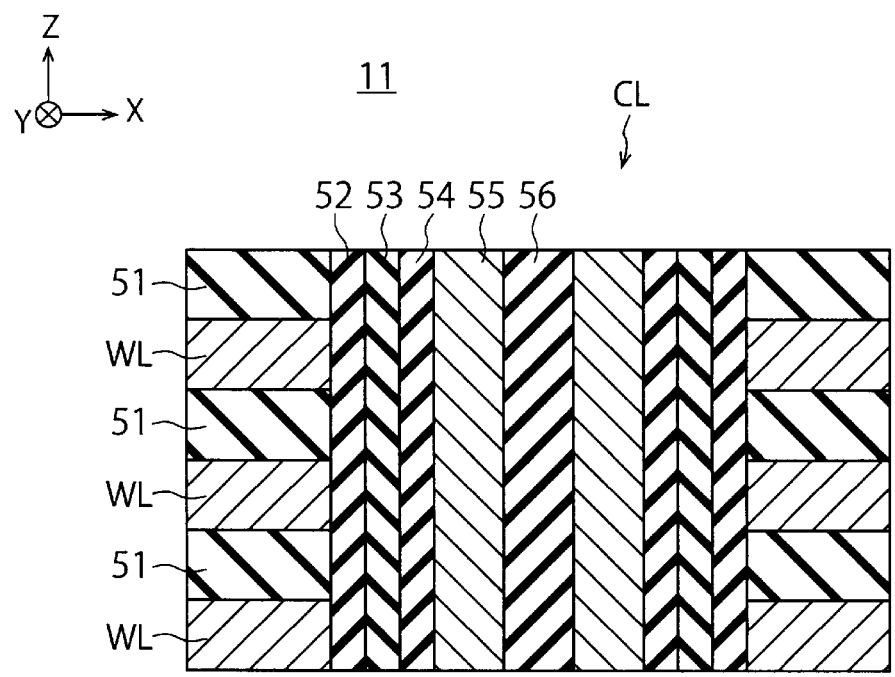
FIG. 2 is a cross-sectional view showing a structure of a columnar portion according to the first embodiment.

FIG. 2 is a cross-sectional view showing a structure of the columnar portion CL according to the first embodiment.

As shown in FIG. 2, the memory cell array 11 includes the plurality of word lines WL and a plurality of insulating layers 51 that are alternately stacked on the interlayer insulating film 13 (FIG. 1). The word line WL includes, for example, a tungsten (W) layer. The insulating layer 51 is, for example, a silicon oxide film.

The columnar portion CL includes a block insulating film 52, a charge storage layer 53, a tunnel insulating film 54, a channel semiconductor layer 55, and a core insulating film 56 in this order. The charge storage layer 53 is, for example, a silicon nitride film, and is formed at side surfaces of the word lines WL and the insulating layers 51 with the block insulating film 52 interposed therebetween. The charge storage layer 53 may be a semiconductor layer such as a polysilicon layer. The channel semiconductor layer 55 is, for example, a polysilicon layer, and is formed at a side surface of the charge storage layer 53 with the tunnel insulating film 54 interposed therebetween. The block insulating film 52, the tunnel insulating film 54, and the core insulating film 56 are, for example, silicon oxide films or metal insulating films.

Figure 3:
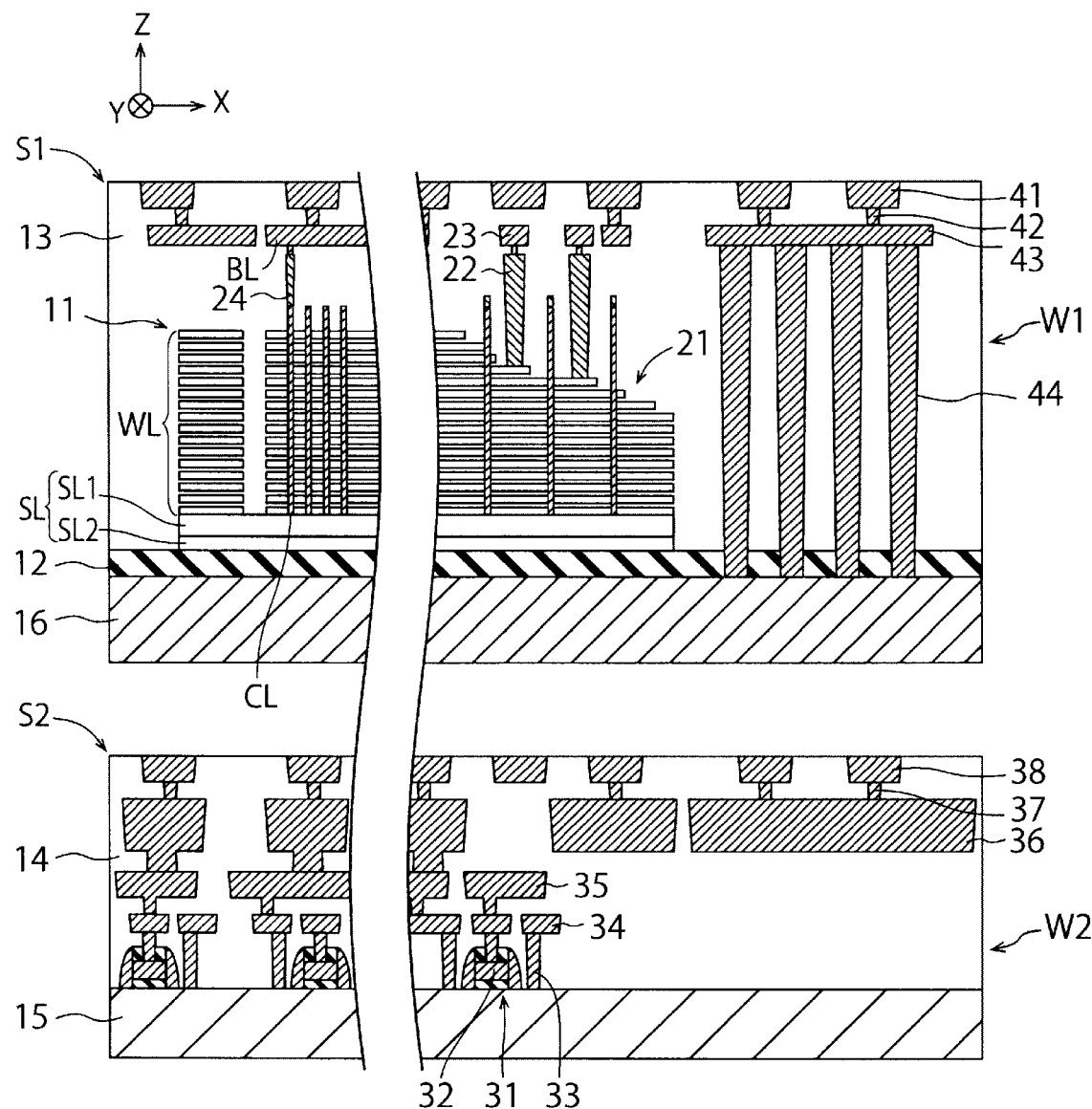
FIG. 3 is a cross-sectional view showing a method for manufacturing the semiconductor device according to the first embodiment.

FIG. 3 is a cross-sectional view showing a method for manufacturing the semiconductor device according to the first embodiment. FIG. 3 shows an array wafer W1 including a plurality of the array chips 1 and a circuit wafer W2 including a plurality of the circuit chips 2. The array wafer W1 is also called a memory wafer, and the circuit wafer W2 is also called a CMOS wafer.

An orientation of the array wafer W1 in FIG. 3 is reversed with respect to an orientation of the array chip 1 in FIG. 1. In the present embodiment, the semiconductor device is manufactured by bonding the array wafer W1 and the circuit wafer W2 to each other. FIG. 3 shows the array wafer W1 before the orientation is reversed for bonding, and FIG. 1 shows the array chip 1 whose orientation is reversed for bonding, and which is bonded and diced.

In FIG. 3, a reference sign S1 indicates an upper surface of the array wafer W1, and a reference sign S2 indicates an upper surface of the circuit wafer W2. The array wafer W1 includes a substrate 16 provided below the insulating film 12. The substrate 16 is, for example, a semiconductor substrate such as a silicon substrate.

In the present embodiment, first, as shown in FIG. 3, the memory cell array 11, the insulating film 12, the interlayer insulating film 13, the staircase structure portion 21, the metal pads 41, and the like are formed on the substrate 16 of the array wafer W1, and the interlayer insulating film 14, the transistors 31, the metal pads 38, and the like are formed on the substrate 15 of the circuit wafer W2. Next, the array wafer W1 and the circuit wafer W2 are bonded to each other by a mechanical pressure. Accordingly, the interlayer insulating film 13 and the interlayer insulating film 14 are adhered to each other. Next, the array wafer W1 and the circuit wafer W2 are annealed at a predetermined temperature (for example, 400° C.). Accordingly, the metal pads 41 and the metal pads 38 are bonded to each other.

Thereafter, the substrate 15 is thinned by chemical mechanical polishing (CMP), the substrate 16 is removed by CMP, and then the array wafer W1 and the circuit wafer W2 are cut into a plurality of chips. Thus, the semiconductor device in FIG. 1 is manufactured. The metal pad 45 and the passivation film 46 are formed on the insulating film 12, for example, after the substrate 15 is thinned and the substrate 16 is removed.

In at least one embodiment embodiment, the array wafer W1 and the circuit wafer W2 are bonded to each other, but instead, the array wafers W1 may be bonded to each other. The contents described above with reference to FIGS. 1 to 3 and contents to be described later with reference to FIGS. 4 to 13 may also be applied to the bonding of the array wafers W1 to each other.

FIG. 1 shows a boundary surface between the interlayer insulating film 13 and the interlayer insulating film 14 and boundary surfaces between the metal pads 41 and the metal pads 38, but these boundary surfaces are generally not observed after the above-described annealing. However, positions of these boundary surfaces can be estimated by detecting, for example, inclination of side surfaces of the metal pads 41 or side surfaces of the metal pads 38 or positional deviation between the side surfaces of the metal pads 41 and the side surfaces of the metal pads 38.

Figure 4A:
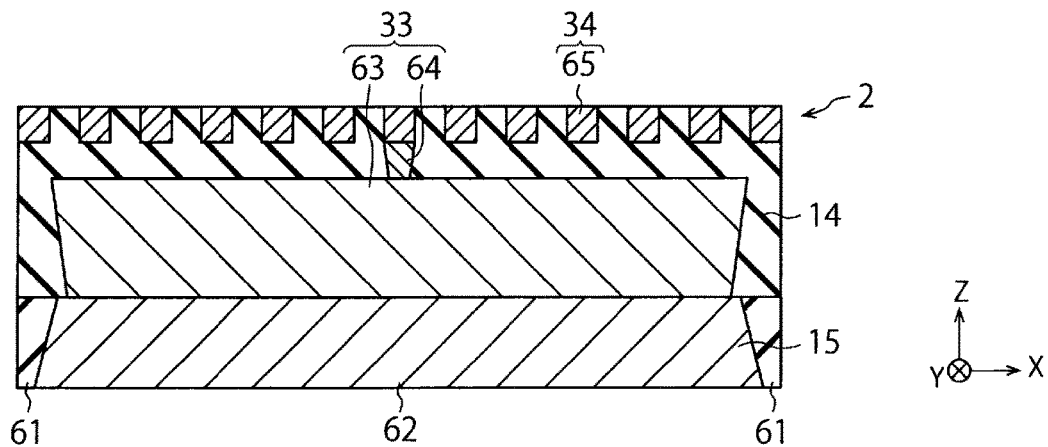
FIGS. 4A and 4B are respectively another cross-sectional view and plan view showing the structure of the semiconductor device according to the first embodiment.
Figure 4B:
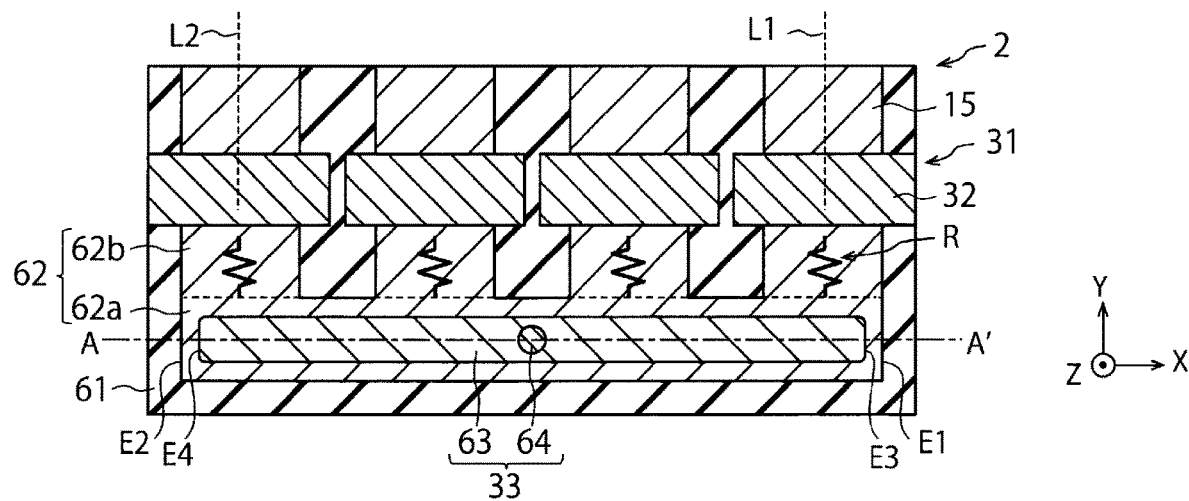

FIGS. 4A and 4B are respectively another cross-sectional view and plan view showing the structure of the semiconductor device according to the first embodiment.

FIGS. 4A and 4B show a cross-sectional structure and a planar structure of the circuit chip 2 shown in FIG. 1, respectively. FIG. 4A shows a cross section taken along a line A-A' shown in FIG. 4B.

FIGS. 4A and 4B show the interlayer insulating film 14, the substrate 15, the plurality of gate electrodes 32 of the plurality of transistors 31, the contact plug 33, and the wiring layer 34, similarly to FIG. 1. FIGS. 4A and 4B further show an element isolation region 61 provided in the substrate 15, an element region 62 which is a part of the substrate 15, a bar contact 63 and a columnar contact 64 that form the contact plug 33, and a plurality of wirings 65 provided in the wiring layer 34.

The element isolation region 61 is provided in a trench formed in the substrate 15. The element isolation region 61 is formed by, for example, a $SiO_2$ film. The element isolation region 61 is also called shallow trench isolation (STI).

The element region 62 is a part of the substrate 15 and is surrounded by the element isolation region 61 in a plan view. The element region 62 is also called an active area (AA). The element region 62 shown in FIGS. 4A and 4B includes an extending portion 62a, which is an example of the first extending portion, and a plurality of protruding portions 62b, which are examples of the plurality of first protruding portions. The element region 62 forms, for example, a sense amplifier for the memory cell array 11. The element region 62 may include regions R1 and R2 to be described below (see FIG. 8B). The regions R1 and R2 are examples of the first and second regions, respectively. A specific example of the sense amplifier will be described in a fifth embodiment to be described later.

As shown in FIG. 4B, the extending portion 62a extends in the X direction (+X direction). As shown in FIG. 4B, each protruding portion 62b protrudes from the extending portion 62a in the Y direction (+Y direction). Therefore, the element region 62 has a comb shape in a plan view. FIG. 4B shows four protruding portions 62b protruding from the extending portion 62a. These protruding portions 62b are adjacent to each other in the X direction and extend in the Y direction. The number of protruding portions 62b of the element region 62 is, for example, $2^N$ (N is an integer of 1 or more), and is $2^2$ here. The extending portion 62a has an end portion E1 in the X direction and an end portion E2 in the -X direction. The end portions E1 and E2 are examples of a first end portion and a second end portion, respectively.

The bar contact 63 is a contact plug having a bar shape extending in the X direction and the Z direction in a plan view. The bar contact 63 includes, for example, a W (tungsten) layer. The bar contact 63 is provided on the extending portion 62a. The bar contact 63 of at least one embodiment is disposed only on the extending portion 62a among the extending portion 62a and the protruding portions 62b. In addition, the bar contact 63 of at least one embodiment is disposed only in the element region 62 among the element isolation region 61 and the element region 62. The bar contact 63 has an end portion E3 in the X direction and an end portion E4 in the -X direction. The bar contact 63 is an example of a first plug. The end portions E3 and E4 are examples of a third end portion and a fourth end portion, respectively.

The columnar contact 64 is a contact plug having a columnar shape extending in the Z direction in a plan view. The columnar contact 64 includes, for example, a W (tungsten) layer. The columnar contact 64 is provided on the bar contact 63. The columnar contact 64 of at least one embodiment is located at a substantially intermediate position between the end portion E1 and the end portion E2 in a plan view, and is located at a substantially intermediate position between the end portion E3 and the end portion E4 in a plan view. The columnar contact 64 is an example of a second plug.

The plurality of wirings 65 are adjacent to each other in the X direction and extend in the Y direction. One of these wirings 65 is provided on the columnar contact 64 as shown in FIG. 4A. These wirings 65 are provided in the wiring layer 34. The wiring layer 34 includes, for example, a W (tungsten) layer, a Cu (copper) layer, or an Al (aluminum) layer. The wiring layer 34 is an example of a first wiring layer.

In FIG. 4B, the plurality of gate electrodes 32 are respectively provided above the plurality of protruding portions 62b so as to respectively overlap with the plurality of protruding portions 62b in the Z direction. Therefore, the plurality of transistors 31 are formed at these protruding portions 62b, respectively. FIG. 4B also schematically shows parasitic resistances R between these gate electrodes 32 and the contact plug 33.

The bar contact 63 of at least one embodiment extends from the vicinity of the end portion E1 of the extending portion 62a to the vicinity of the end portion E2 of the extending portion 62a. Therefore, the end portions E3 and E4 of the bar contact 63 are located in the vicinity of the end portions E1 and E2 of the extending portion 62a, respectively. Since the bar contact 63 is disposed only in the element region 62 among the element isolation region 61 and the element region 62, the end portion E3 is located in the -X direction (left side in FIG. 4B) of the end portion E1, and the end portion E4 is located in the +X direction (right side in FIG. 4B) of the end portion E2.

FIG. 4B shows a center line L1 of the protruding portion 62b among the plurality of protruding portions 62b closest to the end portion E1 and a center line L2 of the protruding portion 62b among the plurality of protruding portions 62b closest to the end portion E2. That is, FIG. 4B shows the center line L1 of the rightmost protruding portion 62b and the center line L2 of the leftmost protruding portion 62b. These center lines L1 and L2 extend in the Y direction. In at least one embodiment, the end portion E3 of the bar contact 63 is located in the +X direction with respect to the center line L1, and the end portion E4 of the bar contact 63 is located in the -X direction with respect to the center line L2. That is, the end portion E3 of the bar contact 63 is located rightward than the center line L1 and the end portion E4 of the bar contact 63 is located leftward than the center line L2.

The bar contact 63 of at least one embodiment faces the four protruding portions 62b shown in FIG. 4B. That is, all of these protruding portions 62b are located in the +Y direction of the bar contact 63, and side surfaces of these protruding portions 62b in the -Y direction face a side surface of the bar contact 63 in the +Y direction. Therefore, the end portion E3 of the bar contact 63 faces the rightmost protruding portion 62b, and the end portion E4 of the bar contact 63 faces the leftmost protruding portion 62b. That is, the bar contact 63 of at least one embodiment extends from the vicinity of the rightmost protruding portion 62b to the vicinity of the leftmost protruding portion 62b.

Figure 5:
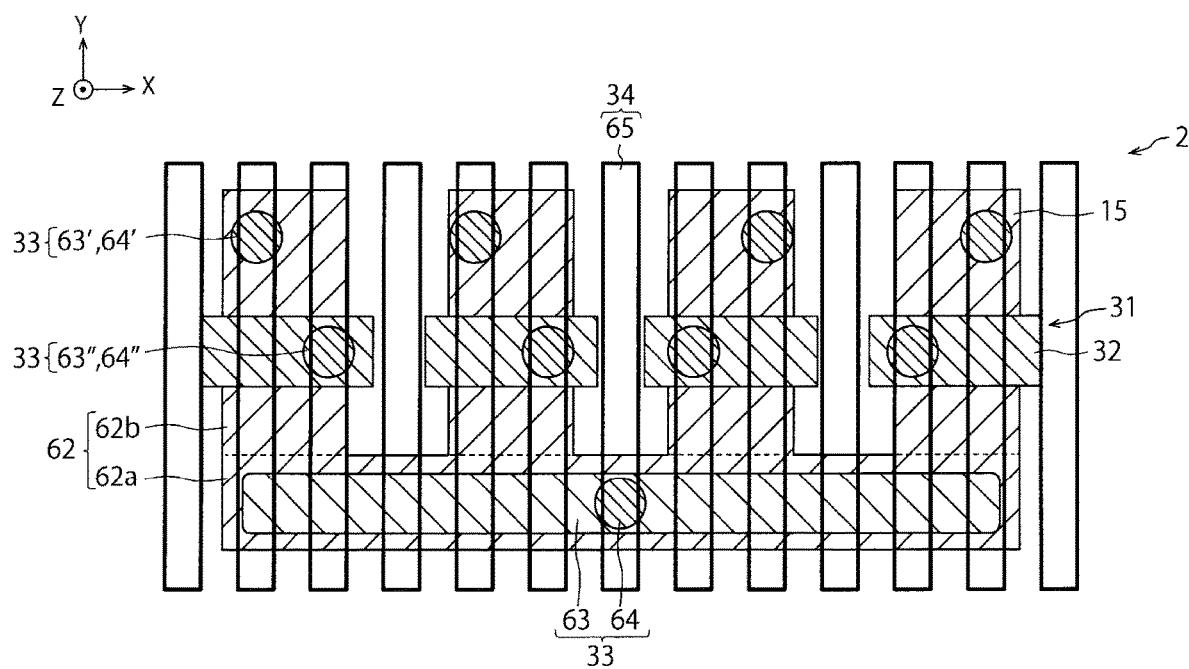
FIG. 5 is another plan view showing the structure of the semiconductor device according to the first embodiment.

FIG. 5 is another plan view showing the structure of the semiconductor device according to the first embodiment.

FIG. 5 shows, in addition to the elements shown in FIG. 4B, the contact plugs 33 provided on the respective protruding portions 62b, the contact plugs 33 provided on the respective gate electrodes 32, and the plurality of wirings 65 provided in the wiring layer 34. FIG. 5 shows outlines of these wirings 65 by thick lines. In FIG. 5, illustration of the element isolation region 61 is omitted.

The contact plug 33 provided on each protruding portion 62b includes a lower contact 63', which is an example of a third plug, and an upper contact 64', which is an example of a fourth plug. The lower contact 63' is provided on the protruding portion 62b. The upper contact 64' is provided on the lower contact 63'. The upper contact 64' is further provided below any one of the wirings 65, and is electrically connected to the wiring 65. Further details of the lower contact 63' and the upper contact 64' will be described in second to fourth embodiments to be described later.

The contact plug 33 provided on each gate electrode 32 includes a lower contact 63", which is an example of the third plug, and an upper contact 64", which is an example of the fourth plug. The lower contact 63" is provided on the gate electrode 32. The upper contact 64" is provided on the lower contact 63". The upper contact 64" is further provided below any one of the wirings 65 and is electrically connected to the wiring 65. Further details of the lower contact 63" and the upper contact 64" will be described in the second to fourth embodiments to be described later.

Each gate electrode 32 of at least one embodiment overlaps with two wirings 65 in a plan view. One of these wirings 65 is disposed above the contact plug 33 (63", 64") on the gate electrode 32. The other of these wirings 65 is disposed above the contact plug 33 (63', 64') on the protruding portion 62b corresponding to the gate electrode 32. Each gate electrode 32 of at least one embodiment may overlap with three or more wirings 65 in a plan view.

The contact plug 33 (63, 64) on the extending portion 62a is electrically connected to one of the source diffusion layer and the drain diffusion layer of each of the plurality of transistors 31. The contact plug 33 (63', 64') on each protruding portion 62b is electrically connected to the other of the source diffusion layer and the drain diffusion layer of the one transistor 31. These contact plugs 33 function as source contacts and drain contacts. Meanwhile, the contact plug 33 (63", 64") on each gate electrode 32 functions as a gate contact of one transistor 31.

Next, semiconductor devices according to comparative examples of the present embodiment will be described with reference to FIGS. 6A to 8B.

Figure 6A:
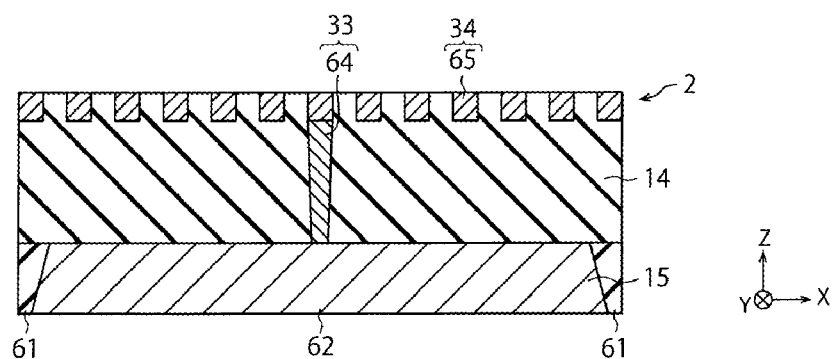
FIGS. 6A and 6B are respectively a cross-sectional view and a plan view showing a structure of a semiconductor device according to a first comparative example.
Figure 6B:
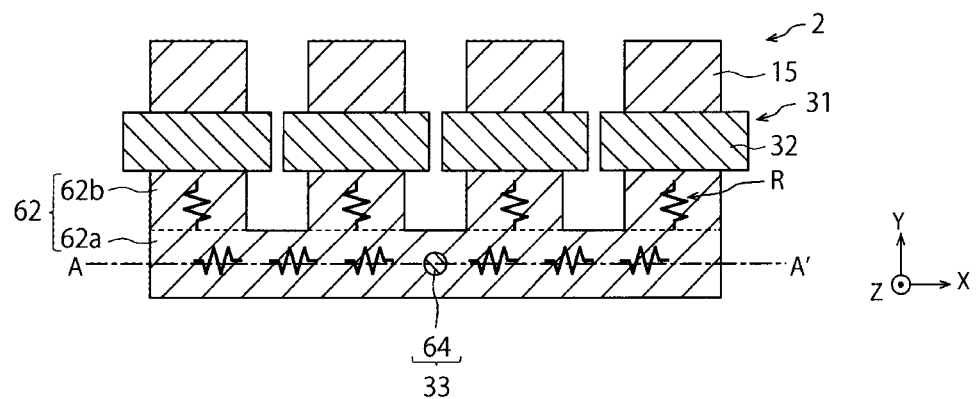

FIGS. 6A and 6B are respectively a cross-sectional view and a plan view showing a structure of a semiconductor device according to a first comparative example.

FIGS. 6A and 6B show a cross-sectional structure and a planar structure of the circuit chip 2 according to the present comparative example, respectively. The element region 62 of the present comparative example has the same shape as the element region 62 of the present embodiment. However, the contact plug 33 on the extending portion 62a of the present comparative example does not include the bar contact 63, and includes only the columnar contact 64.

Therefore, the parasitic resistance R between each gate electrode 32 and the contact plug 33 (64) according to the present comparative example is different for each gate electrode 32. For example, in the rightmost gate electrode 32 and the leftmost gate electrode 32, the parasitic resistances R are large because distances between the gate electrodes 32 and the contact plug 33 are long. On the other hand, in the second gate electrode 32 from the right and the second gate electrode 32 from the left, the parasitic resistances R are small because distances between the gate electrodes 32 and the contact plug 33 are short. As a result, characteristics of the four transistors 31 of the present comparative example vary.

In order to miniaturize the semiconductor device of the present comparative example, it is desirable to increase the number of the protruding portions 62b of the element region 62 and to share the contact plug 33 (64) for these protruding portions 62b. Accordingly, the semiconductor device can be miniaturized by miniaturizing the sense amplifier formed by the element region 62. However, when the number of protruding portions 62b is increased, the characteristics of the transistors 31 vary due to the difference in the parasitic resistances R.

Figure 7A:
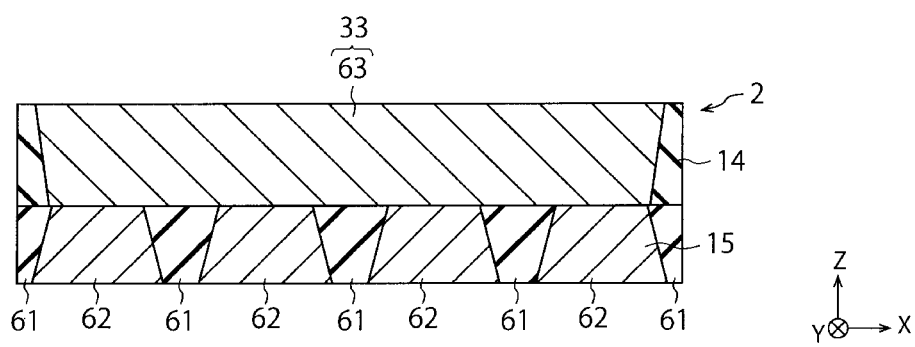
FIGS. 7A and 7B are respectively a cross-sectional view and a plan view showing a structure of a semiconductor device according to a second comparative example.
Figure 7B:
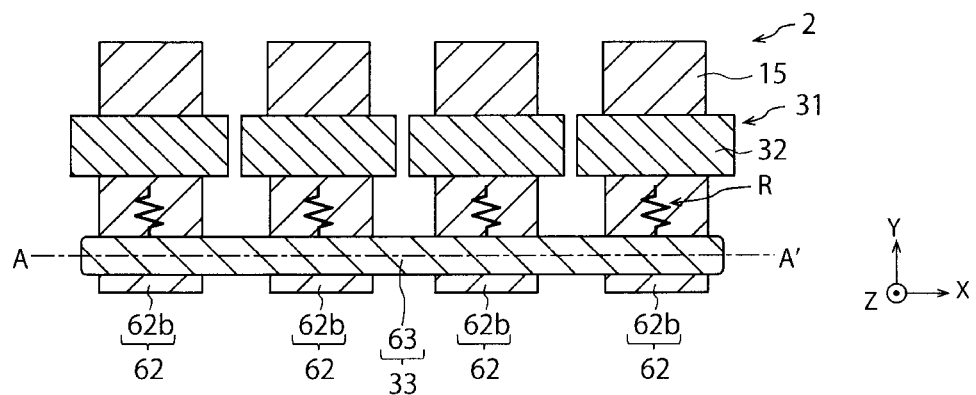

FIGS. 7A and 7B are respectively a cross-sectional view and a plan view showing a structure of a semiconductor device according to a second comparative example.

FIGS. 7A and 7B show a cross-sectional structure and a planar structure of the circuit chip 2 of the present comparative example, respectively. FIGS. 7A and 7B show four element regions 62 each of which is a part of the substrate 15, and each of these element regions 62 includes one protruding portion 62b. FIGS. 7A and 7B further show the contact plug 33 provided on the four protruding portions 62b, and the contact plug 33 does not include the columnar contact 64 and includes only the bar contact 63. According to the present comparative example, the semiconductor device can be miniaturized by sharing the contact plug 33 (63) for these protruding portions 62b.

The parasitic resistance R between each gate electrode 32 and the contact plug 33 (63) according to the present comparative example is not different for each gate electrode 32, and is the same for any gate electrode 32. The reason is that the distance between each gate electrode 32 and the contact plug 33 is the same for all the gate electrodes 32. Therefore, according to the present comparative example, it is possible to miniaturize the semiconductor device while preventing variations in the characteristics of the four transistors 31.

Figure 8A:
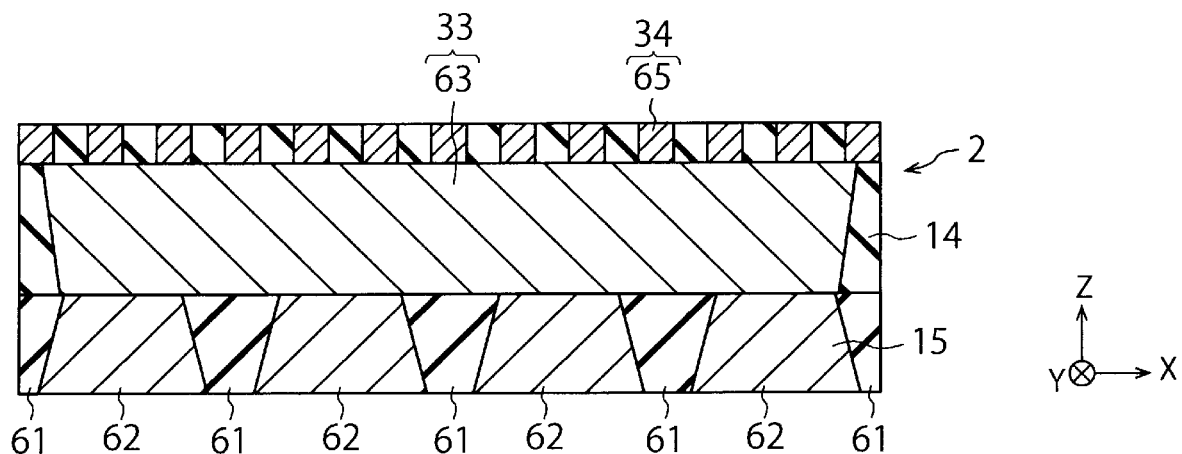
FIGS. 8A and 8B are other cross-sectional views showing the structure of the semiconductor device according to the second comparative example.
Figure 8B:
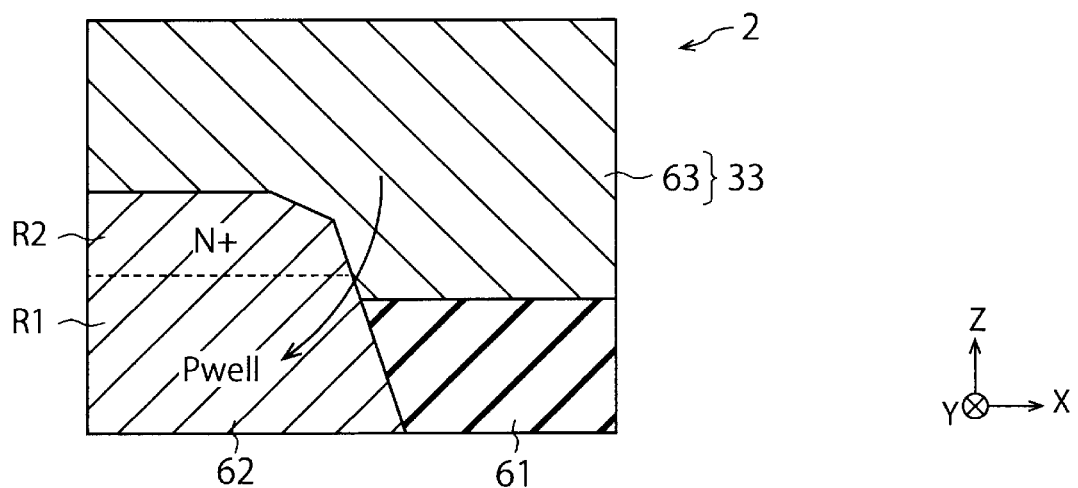

FIGS. 8A and 8B are other cross-sectional views showing the structure of the semiconductor device according to the second comparative example.

FIG. 8A shows a cross-sectional structure of the circuit chip 2 of the present comparative example, similarly to FIG. 7A. FIG. 8A shows the wiring layer 34 including the plurality of wirings 65 in addition to the elements shown in FIG. 7A. When the wiring layer 34 is disposed on the contact plug 33 (63) in the present comparative example, the plurality of wirings 65 may be in contact with the contact plug 33 (63), and these wirings 65 may be short-circuited.

FIG. 8B shows an enlarged cross section of the element isolation region 61, the element region 62, and the bar contact 63 of the present comparative example. The element region 62 of the present comparative example includes the region R1 which is a P-type region and the region R2 which is an N-type region and is provided on the region R1. The region R1 is, for example, a P-type well. The region R2 is, for example, an N+ type region. The regions R1 and R2 are examples of the first and second regions, respectively. The P type and the N type are examples of first and second conductivity types, respectively. The regions R1 and R2 are also provided in the element region 62 according to at least one embodiment and in the element region 62 according to the first comparative example.

In FIG. 8B, a height of an upper surface of the element isolation region 61 is lower than a height of an upper surface of the element region 62. The element isolation region 61 is formed, for example, by forming a trench in the substrate 15, forming an insulating film for the element isolation region 61 at the entire surface of the substrate 15, and removing the insulating film outside the trench. At this time, when the insulating film is removed excessively, the height of the upper surface of the element isolation region 61 may be lower than the height of the upper surface of the element region 62.

In FIG. 8B, the height of the upper surface of the element isolation region 61 is lower than a height of an interface between the region R1 and the region R2. As a result, the bar contact 63 of the present comparative example is in contact with the region R1. The reason is that the bar contact 63 of the present comparative example is disposed at the element regions 62 and the element isolation region 61. In this case, as shown by an arrow in FIG. 8B, a leak current flowing from the bar contact 63 to the region R1 may be generated.

On the other hand, the semiconductor device of at least one embodiment has the structure shown in FIGS. 4A and 4B. The element region 62 of at least one embodiment includes the extending portion 62*a* and the plurality of protruding portions 62*b*. Further, the contact plug 33 (63, 64) of at least one embodiment includes the bar contact 63 provided on the extending portion 62*a* and the columnar contact 64 provided on the bar contact 63.

According to at least one embodiment, by sharing the contact plug 33 (63, 64) for the protruding portions 62*b*, the semiconductor device can be miniaturized as in the first and second comparative examples.

According to at least one embodiment, by adopting the bar contact 63 as in the second comparative example, the parasitic resistance R between each gate electrode 32 and the contact plug 33 (63, 64) can be made substantially the same in any gate electrode 32. Therefore, according to at least one embodiment, it is possible to miniaturize the semiconductor device while preventing variations in the characteristics of the plurality of transistors 31.

Unlike the semiconductor device of the second comparative example, the semiconductor device of at least one embodiment includes the extending portion 62*a*, and the bar contact 63 of the at least one is provided on the extending portion 62*a*. Accordingly, generation of a leak current as in the second comparative example (see FIG. 8B) can be prevented.

The contact plug 33 (63, 64) of at least one embodiment includes the columnar contact 64 in addition to the bar contact 63. Accordingly, it is possible to prevent the plurality of wirings 65 from coming into contact with the contact plug 33 (63, 64), and it is possible to prevent these wirings 65 from being short-circuited (see FIG. 8A). In FIG. 4A, only one of the plurality of wirings 65 is provided on the columnar contact 64.

As described above, according to at least one embodiment, it is possible to suitably form the contact plug 33 that is in contact with the substrate 15. For example, according to at least one embodiment, it is possible to take advantages of the first and second comparative examples while preventing disadvantages of the first and second comparative examples.

Next, semiconductor devices according to modifications of the present embodiment will be described with reference to FIGS. 9A to 10C.

Figure 9A:
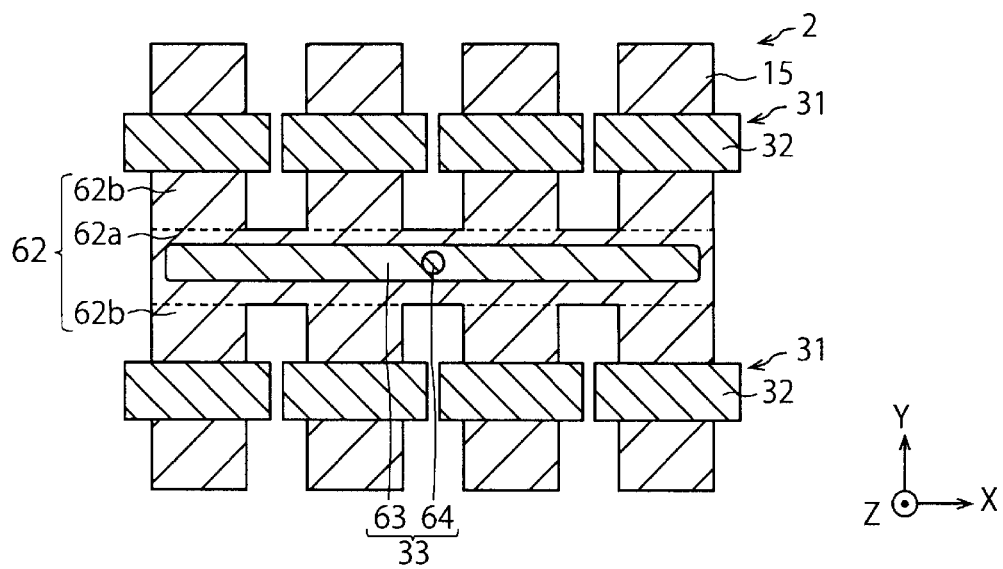
FIGS. 9A and 9B are plan views showing structures of semiconductor devices according to two modifications of the first embodiment.
Figure 9B:
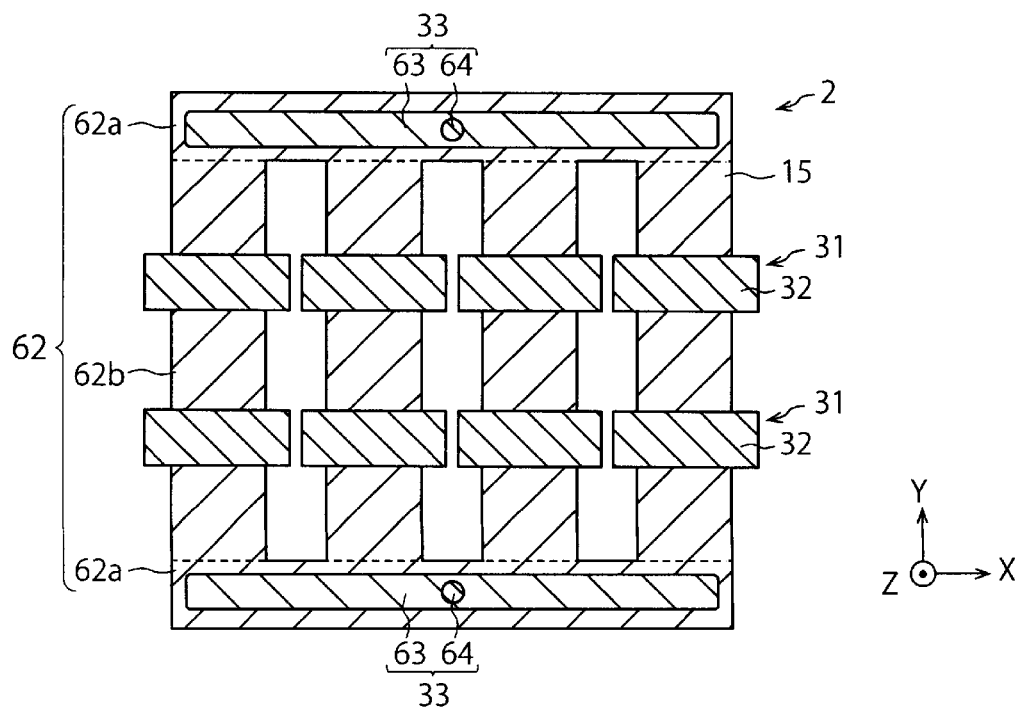

FIGS. 9A and 9B are plan views showing structures of semiconductor devices according to two modifications of the first embodiment.

The element region 62 of the modification shown in FIG. 9A includes not only the plurality of protruding portions 62*b* protruding from the extending portion 62*a* in the +Y direction but also the plurality of protruding portions 62*b* protruding from the extending portion 62*a* in the −Y direction. The former protruding portions 62*b* are an example of a plurality of first protruding portions, and the latter protruding portions 62*b* are an example of a plurality of second protruding portions. The latter protruding portion 62*b* has the same structure as the former protruding portion 62*b*. For example, each of the latter protruding portions 62*b* is provided below the gate electrode 32 of one transistor 31. According to the present modification, more protruding portions 62*b* can protrude from the extending portion 62*a*.

The element region 62 of the modification shown in FIG. 9B includes not only the extending portion 62*a* provided in the −Y direction of the protruding portions 62*b* but also the extending portion 62*a* provided in the +Y direction of the protruding portions 62*b*. The former extending portion 62*a* is an example of a first extending portion, and the latter extending portion 62*a* is an example of a second extending portion. Each protruding portion 62*b* of the present modification protrudes from the former extending portion 62*a* in the +Y direction, and protrudes from the latter extending portion 62*a* in the −Y direction. The latter extending portion 62*a* has the same structure as the former extending portion 62*a*. For example, the latter extending portion 62*a* extends in the +X direction and is provided below the bar contact 63. The bar contact 63 is provided below the columnar contact 64. According to the present modification, more transistors 31 can be disposed at the element region 62. In FIG. 9B, since each protruding portion 62*b* is provided below the gate electrodes 32 of the two transistors 31, eight transistors 31 are disposed at the element region 62.

Figure 10A:
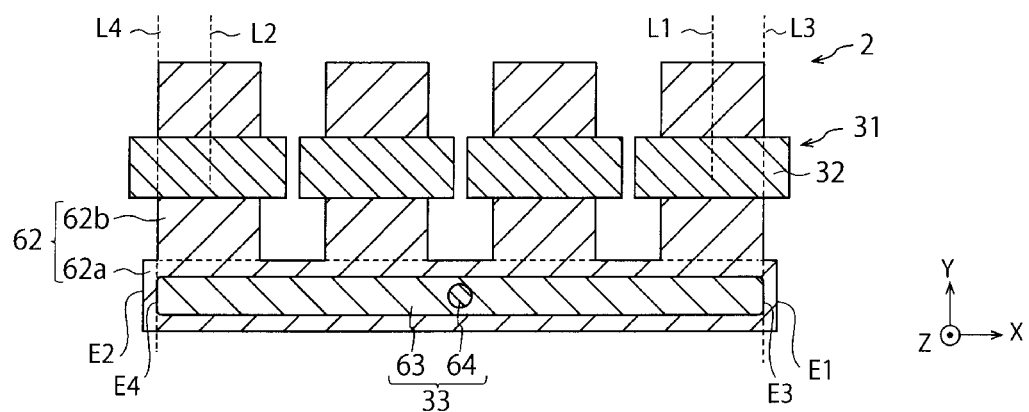
FIGS. 10A-10C are plan views showing a structure of a semiconductor device according to another modification of the first embodiment.
Figure 10B:
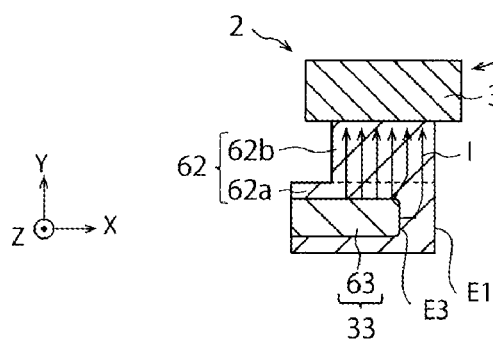
Figure 10C:
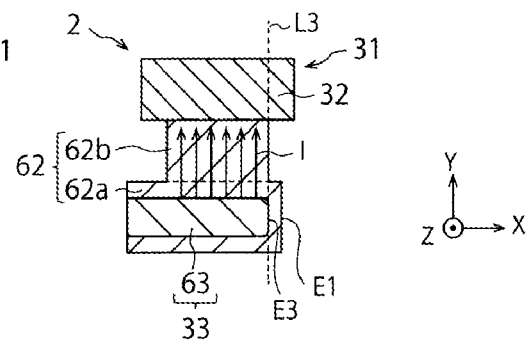

FIGS. 10A to 10C are plan views showing a structure of a semiconductor device according to another modification of the first embodiment.

The element region 62 according to the modification shown in FIG. 10A has the same structure as the element region 62 of at least one embodiment. In the element region 62 of the present modification, the end portion E1 of the extending portion 62*a* protrudes in the +X direction with respect to the rightmost protruding portion 62*b*, and the end portion E2 of the extending portion 62*a* protrudes in the −X direction with respect to the leftmost protruding portion 62*b*.

FIG. 10A shows a straight line L3 passing through a right side surface of the rightmost protruding portion 62*b* and a straight line L4 passing through a left side surface of the leftmost protruding portion 62*b*. Since the end portion E1 of the extending portion 62*a* protrudes in the +X direction with respect to the rightmost protruding portion 62*b*, the end portion E1 is located rightward than the straight line L3. Similarly, since the end portion E2 of the extending portion 62*a* protrudes in the −X direction with respect to the leftmost protruding portion 62*b*, the end portion E2 is located leftward than the straight line L4.

FIG. 10A further shows the end portion E3 of the bar contact 63 in the X direction and the end portion E4 of the bar contact 63 in the −X direction. The end portions E3 and E4 of the present modification are located in the vicinity of the end portions E1 and E2, similarly to the end portions E3 and E4 of at least one embodiment. Therefore, the end portion E3 of the bar contact 63 of the present modification reaches the straight line L3 as shown in FIG. 10A. Similarly, the end portion E4 of the bar contact 63 of the present modification reaches the straight line L4.

Next, with reference to FIGS. 10B and 10C, the element region 62 of at least one embodiment is compared with the element region 62 of the present modification.

FIG. 10B shows a structure in the vicinity of the end portion E1 of the element region 62 of at least one embodiment. A reference sign I indicates a current from the bar contact 63 toward the rightmost gate electrode 32. Since the end portion E3 of the bar contact 63 of the present embodiment does not reach the straight line L3, there is a portion where the current I flows non-linearly. This may cause the parasitic resistance R to be different for each gate electrode 32.

FIG. 10C shows a structure in the vicinity of the end portion E1 of the element region 62 of the present modification. Since the end portion E3 of the bar contact 63 of the present modification reaches the straight line L3, linearity of a path through which the current I flows can be improved. Accordingly, the parasitic resistance R can be made substantially the same for all of the gate electrodes 32. According to the present modification, it becomes easier to bring the parasitic resistances R of different gate electrodes 32 closer to the same value as compared with at least one embodiment.

As described above, the element region 62 of at least one embodiment includes the extending portion 62a extending in the X direction and the protruding portions 62b protruding from the extending portion 62a in the Y direction. In addition, the contact plug 33 (63, 64) of at least one embodiment includes the bar contact 63 provided at the extending portion 62a and extending in the X direction. Therefore, according to at least one embodiment, it is possible to suitably form the contact plug 33 (63, 64) in contact with the substrate 15. For example, according to at least one embodiment, it is possible to take the advantages of the first and second comparative examples while preventing the disadvantages of the first and second comparative examples.

Second Embodiment

Figure 11A:
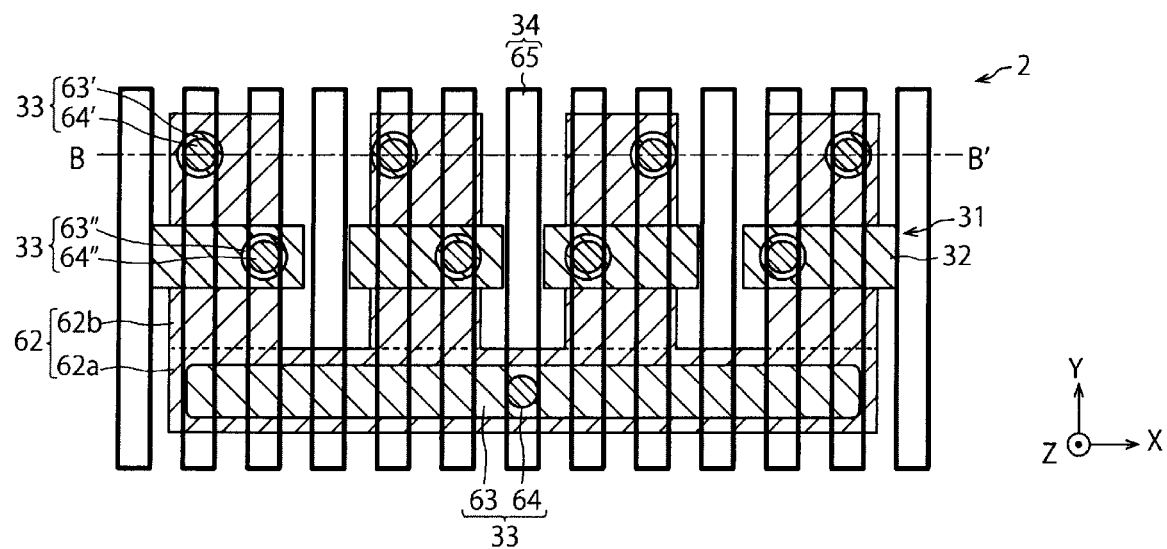
FIGS. 11A and 11B are respectively a plan view and a cross-sectional view showing a structure of a semiconductor device according to a second embodiment.
Figure 11B:
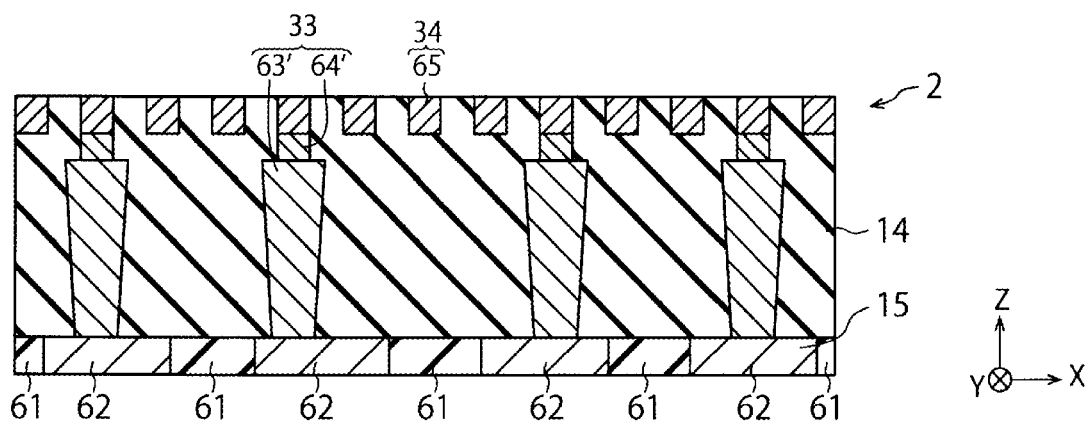

FIGS. 11A and 11B are respectively a plan view and a cross-sectional view showing a structure of a semiconductor device according to a second embodiment.

FIG. 11A shows a planar structure of the circuit chip 2 of at least one embodiment, as in FIG. 5. FIG. 11B shows a cross section taken along a line B-B' shown in FIG. 11A.

As shown in FIGS. 11A and 11B, the contact plug 33 provided on each protruding portion 62b includes the lower contact 63' and the upper contact 64'. According to at least one embodiment, a shape of the lower contact 63' is a circle in a plan view, and a shape of the upper contact 64' is also a circle in a plan view. A diameter of the circle that is the shape of the upper contact 64' is set smaller than a diameter of the circle that is the shape of the lower contact 63'. In a plan view, a central axis (center of the circle) of the upper contact 64' of at least one embodiment overlaps with a central axis (center of the circle) of the lower contact 63'. The same also applies to the contact plug 33 provided on each gate electrode 32. The contact plug 33 provided on each gate electrode 32 includes the lower contact 63" and the upper contact 64".

According to at least one embodiment, these contact plugs 33 can be suitably disposed on the protruding portions 62b or the gate electrodes 32.

Third Embodiment

Figure 12A:
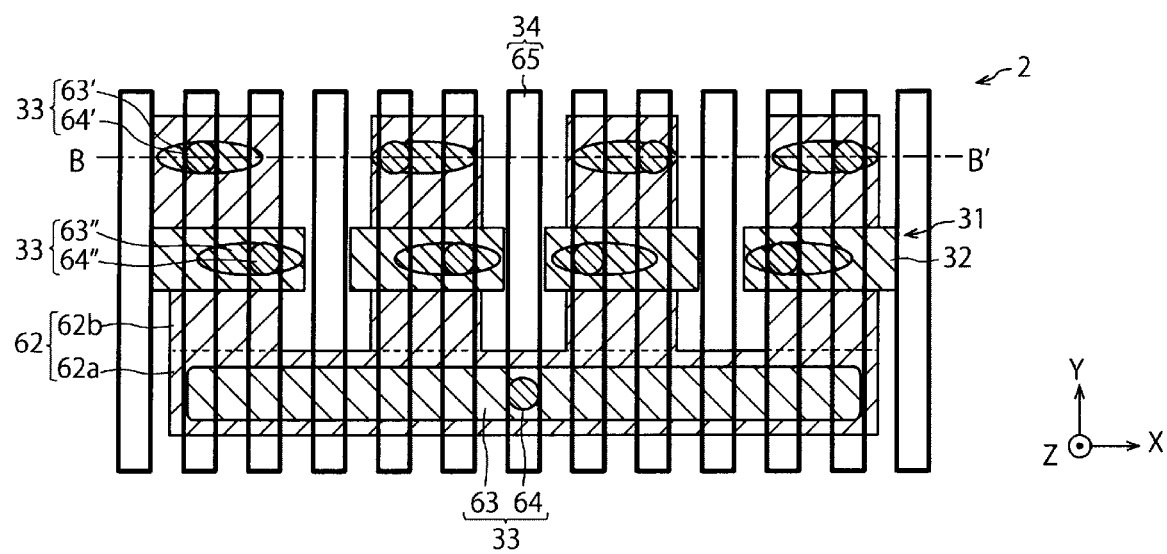
FIGS. 12A and 12B are respectively a plan view and a cross-sectional view showing a structure of a semiconductor device according to a third embodiment.
Figure 12B:
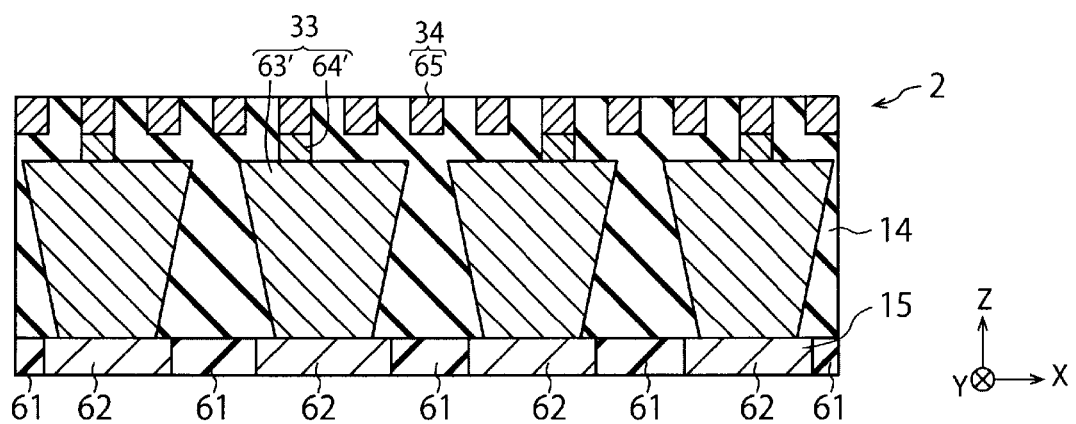

FIGS. 12A and 12B are respectively a plan view and a cross-sectional view showing a structure of a semiconductor device according to a third embodiment.

FIG. 12A shows a planar structure of the circuit chip 2 of at least one embodiment, as in FIG. 5. FIG. 12B shows a cross section taken along a line B-B' shown in FIG. 12A.

As shown in FIGS. 12A and 12B, the contact plug 33 provided on each protruding portion 62b includes the lower contact 63' and the upper contact 64'. In at least one embodiment, a shape of the lower contact 63' is an ellipse in a plan view, and a shape of the upper contact 64' is a circle in a plan view. In a plan view, a central axis (center of the ellipse) of the upper contact 64' of at least one embodiment does not overlap with a central axis (center of the circle) of the lower contact 63'. For example, each upper contact 64' is disposed in the vicinity of a left end of the corresponding lower contact 63' and in the vicinity of a right end of the corresponding lower contact 63' in a plan view. The same also applies to the contact plug 33 provided on each gate electrode 32. The contact plug 33 provided on each gate electrode 32 includes the lower contact 63" and the upper contact 64".

According to at least one embodiment, these contact plugs 33 can be suitably disposed on the protruding portions 62b or the gate electrodes 32. In addition, since the shapes of the lower contacts 63' and 63" according to at least one embodiment are ellipses, it is possible to increase a contact area between the lower contact 63' and the protruding portion 62b and a contact area between the lower contact 63" and the gate electrode 32.

Fourth Embodiment

Figure 13A:
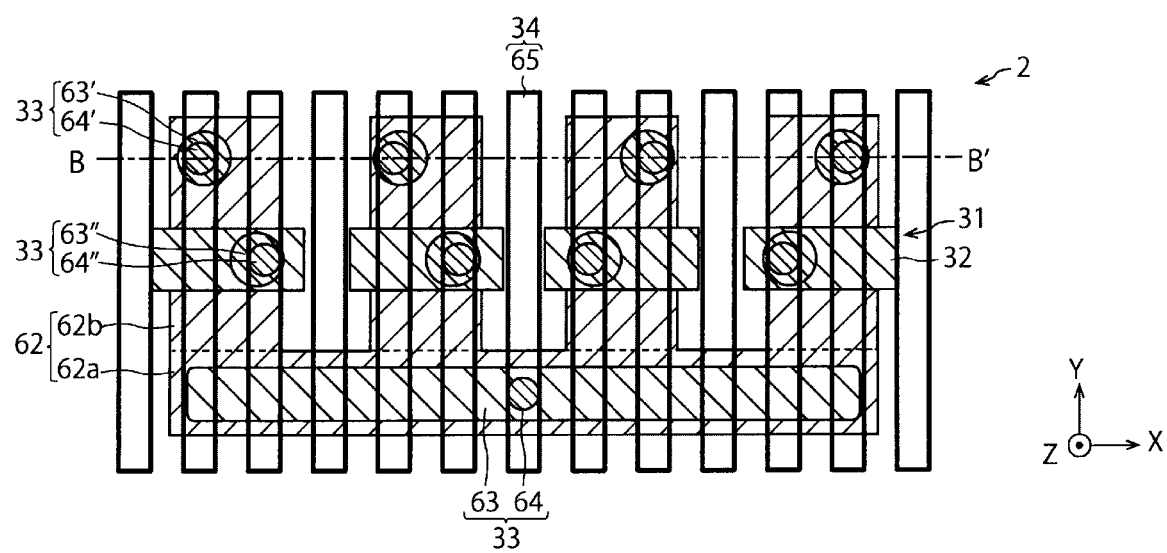
FIGS. 13A and 13B are respectively a plan view and a cross-sectional view showing a structure of a semiconductor device according to a fourth embodiment.
Figure 13B:
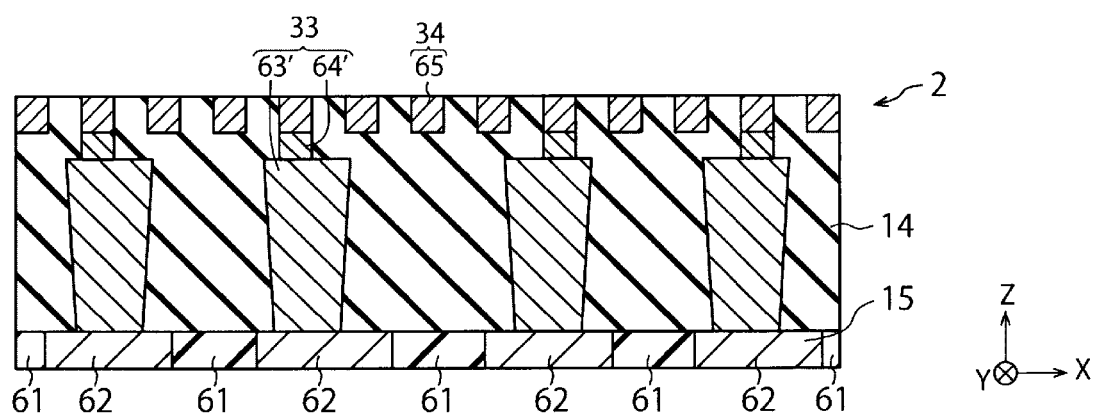

FIGS. 13A and 13B are respectively a plan view and a cross-sectional view showing a structure of a semiconductor device according to a fourth embodiment.

FIG. 13A shows a planar structure of the circuit chip 2 of at least one embodiment, as in FIG. 5. FIG. 13B shows a cross section taken along a line B-B' shown in FIG. 13A.

As shown in FIGS. 13A and 13B, the contact plug 33 provided on each protruding portion 62b includes the lower contact 63' and the upper contact 64'. According to at least one embodiment, a shape of the lower contact 63' is a circle in a plan view, and a shape of the upper contact 64' is also a circle in a plan view. A diameter of the circle that is the shape of the upper contact 64' is set smaller than a diameter of the circle that is the shape of the lower contact 63'. In a plan view, a central axis (center of the circle) of the upper contact 64' of at least one embodiment does not overlap with a central axis (center of the circle) of the lower contact 63'. The same also applies to the contact plug 33 provided on each gate electrode 32. The contact plug 33 provided on each gate electrode 32 includes the lower contact 63" and the upper contact 64".

According to at least one embodiment, these contact plugs 33 can be suitably disposed on the protruding portions 62b or the gate electrodes 32. In addition, in the contact plug 33 of at least one embodiment, since a difference between the diameter of the circle of the lower contact 63' or 63" and the diameter of the circle of the upper contact 64' or 64" is set to be large, the central axis of the upper contact 64' or 64" can be largely shifted from the central axis of the lower contact 63' or 63". The reason is that since the difference in the diameters is large, the upper contact 64' or 64" can be formed on an upper surface of the lower contact 63' or 63" even when the central axes are largely shifted. On the other hand, when the difference in the diameters is small, the upper contact 64' or 64" may be formed at a position other than the upper surface of the lower contact 63' or 63" when the central axes are largely shifted. Therefore, according to at least one embodiment, it is possible to tolerate a large margin with respect to an error of lithography for determining positions of the upper contacts 64' and 64".

The same also applies to the third embodiment. Since the shapes of the lower contacts 63' and 63" of the third embodiment are ellipses extending in the X direction, it is possible to tolerate a large margin with respect to an error in the X direction. On the other hand, according to at least one embodiment, it is possible to tolerate not only the large margin with respect to the error in the X direction but also a large margin with respect to an error in the Y direction.

Fifth Embodiment

Figure 14:
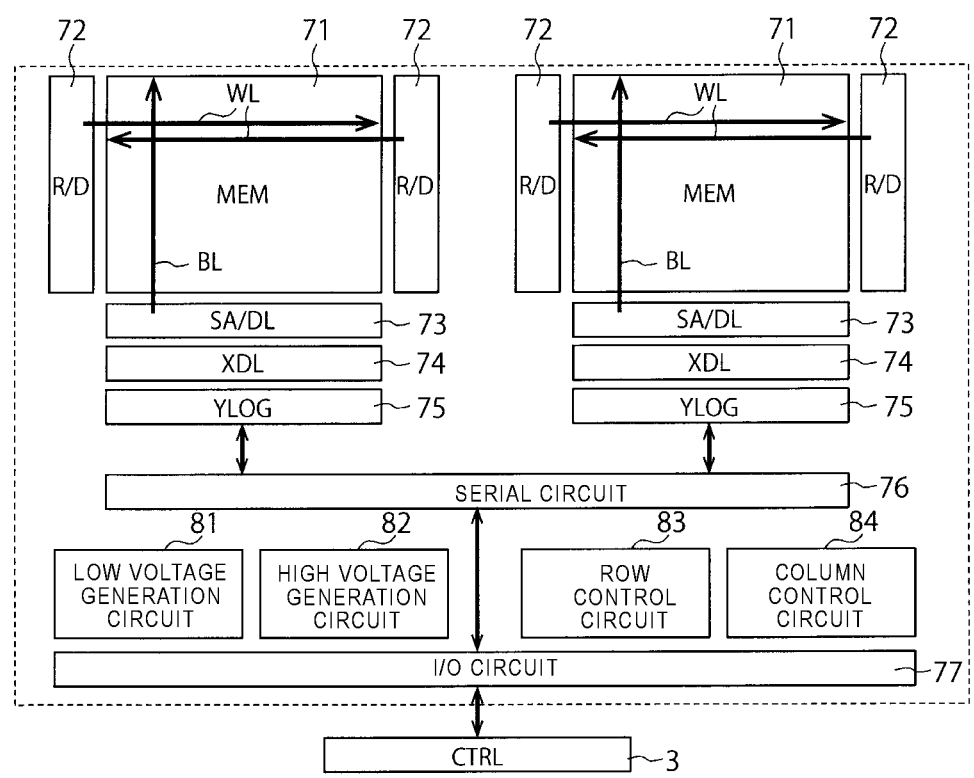
FIG. 14 is a circuit diagram showing a configuration of a semiconductor device according to a fifth embodiment.

FIG. 14 is a circuit diagram showing a configuration of a semiconductor device according to a fifth embodiment. The semiconductor device of at least one embodiment is an example of the semiconductor device according to any one of the first to fourth embodiments.

FIG. 14 shows a plurality of planes 71 forming the memory cell array 11, and a plurality of row decoders 72, a plurality of SA/DL units 73, a plurality of XDL units 74, and a plurality of YLOG units 75 that are provided for these planes 71. FIG. 14 further shows a serial circuit 76, an input/output (I/O) circuit 77, a low voltage generation circuit 81, a high voltage generation circuit 82, a row control circuit 83, and a column control circuit 84. These circuits are located in the vicinity of the memory cell array 11 in the array chip 1 or in a logic circuit in the circuit chip 2. FIG. 14 further shows a controller 3 provided in the semiconductor device according to at least one embodiment.

Each plane 71 includes a plurality of memory cells, a plurality of word lines WL, a plurality of the bit lines BL, and the like. Each row decoder 72 applies a control voltage to a control wiring such as the word line WL. Examples of such a control voltage include a write voltage (VPRG), an erase voltage (VERASE), an intermediate voltage (VPASS), and a source voltage (VSL). Each SA/DL unit 73 is a sense amplifier circuit and a data latch circuit that detect data read out on the bit line BL. Each XDL unit 74 is a data latch circuit that stores data transmitted from the SA/DL unit 73 or the I/O circuit 77. Each YLOG unit 75 decodes a column address and selects the latch circuit in the XDL unit 74 based on a decoding result. The serial circuit 76 provides a serial bus or the like shared by the plurality of planes 71, and the I/O circuit 77 transmits and receives an input signal and an output signal to and from the controller 3.

The low voltage generation circuit 81 and the high voltage generation circuit 82 form a control voltage generation circuit, and generate a low voltage and a high voltage used as control voltages, respectively. The row control circuit 83 and the column control circuit 84 control rows and columns of each plane 71, respectively.

According to at least one embodiment, it is possible to realize a circuit configuration that can obtain the effects described in the first to fourth embodiments.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
    a substrate including (i) an element region including a first extending portion extending in a first direction, and (ii) a plurality of first protruding portions protruding from the first extending portion in a second direction intersecting the first direction;
    a first plug disposed on the first extending portion, the first plug extending in the first direction and in a third direction intersecting the first direction and the second direction; and
    a plurality of gate electrodes respectively disposed above the plurality of first protruding portions, respectively overlapping with the plurality of first protruding portions in the third direction.

2. The semiconductor device according to claim 1, wherein
    the first plug is disposed only on the first extending portion among the first extending portion and the first protruding portions.

3. The semiconductor device according to claim 1, wherein
    the first extending portion has a first end portion and a second end portion, the first end portion extending in the first direction, and the second end portion extending in a direction opposite to the first direction, wherein the first plug has a third end portion in the first direction and a fourth end portion in the direction opposite to the first direction,
    the third end portion of the first plug faces the first protruding portion closest to the first end portion among the plurality of first protruding portions, and
    the fourth end portion of the first plug faces the first protruding portion closest to the second end portion among the plurality of first protruding portions.

4. The semiconductor device according to claim 3, wherein
    the third end portion of the first plug is located in the first direction with respect to a center line of the first protruding portion closest to the first end portion among the plurality of first protruding portions, and
    the fourth end portion of the first plug is located in the direction opposite to the first direction with respect to a center line of the first protruding portion closest to the second end portion among the plurality of first protruding portions.

5. The semiconductor device according to claim 1, further comprising:
    a second plug disposed on the first plug.

6. The semiconductor device according to claim 5, wherein
    the second plug has a columnar shape extending in the third direction.

7. The semiconductor device according to claim 5, further comprising:
    a first wiring layer including a plurality of wirings extending in the second direction, wherein
    one of the plurality of wirings is disposed on the second plug.

8. The semiconductor device according to claim 7, wherein
    one of the plurality of gate electrodes overlaps with two or more of the plurality of wirings in a plan view.

9. The semiconductor device according to claim 1, further comprising:
    an element isolation region disposed in the substrate, wherein
    the first plug is disposed only in the element region among the element region and the element isolation region.

10. The semiconductor device according to claim 1, wherein
the element region further includes a plurality of second protruding portions protruding from the first extending portion in a direction opposite to the second direction.

11. The semiconductor device according to claim 1, wherein
the element region further includes a second extending portion extending in the first direction, and
the plurality of first protruding portions protrude from the second extending portion in a direction opposite to the second direction.

12. The semiconductor device according to claim 1, wherein
the first extending portion has a first end portion and a second end portion, the first end portion extending in the first direction, the second end portion extending in a direction opposite to the first direction,
the first end portion of the first extending portion protrudes in the first direction with respect to the first protruding portion closest to the first end portion among the plurality of first protruding portions, and
the second end portion of the first extending portion protrudes in the direction opposite to the first direction with respect to the first protruding portion closest to the second end portion among the plurality of first protruding portions.

13. The semiconductor device according to claim 1, further comprising:
a plurality of third plugs respectively disposed on the plurality of gate electrodes or the plurality of first protruding portions; and
a plurality of fourth plugs respectively disposed on the plurality of third plugs.

14. The semiconductor device according to claim 13, wherein
in a plan view, a shape of the third plug is a circle, and a shape of the fourth plug is a circle.

15. The semiconductor device according to claim 14, wherein
in a plan view, a central axis of the fourth plug does not overlap with a central axis of the third plug.

16. The semiconductor device according to claim 13, wherein
in a plan view, a shape of the third plug is an ellipse, and a shape of the fourth plug is a circle.

17. The semiconductor device according to claim 13, further comprising:
a first wiring layer including a plurality of wirings extending in the second direction, wherein
the plurality of wirings include a wiring disposed on the second plug and a plurality of wirings respectively disposed on the plurality of fourth plugs.

18. The semiconductor device according to claim 1, wherein
the first direction and the second direction are parallel to a surface of the substrate and perpendicular to each other, and the third direction is perpendicular to the surface of the substrate.

19. The semiconductor device according to claim 1, wherein
the element region is a sense amplifier of a semiconductor memory.

20. A semiconductor device, comprising:
a substrate including an element region including (i) a first extending portion extending in a first direction, and (ii) a plurality of first protruding portions protruding from the first extending portion in a second direction intersecting the first direction;
a first plug disposed on the first extending portion, the first plug extending in the first direction and in a third direction intersecting the first direction and the second direction; and
a plurality of gate electrodes respectively disposed above the plurality of first protruding portions so as to respectively overlap with the plurality of first protruding portions in the third direction, wherein
the element region includes a first region and a second region, the first region having a first conductivity type, the second region having a second conductivity type different from the first conductivity type and disposed on the first region.

* * * * *